United States Patent
Ewanchuk et al.

(10) Patent No.: US 10,848,052 B2
(45) Date of Patent: Nov. 24, 2020

(54) DEVICE AND METHOD FOR CONTROLLING TEMPERATURE OF MULTI-DIE POWER MODULE

(71) Applicant: MITSUBISHI ELECTRIC CORPORATION, Tokyo (JP)

(72) Inventors: Jeffrey Ewanchuk, Rennes (FR); Julio Cezar Brandelero, Rennes (FR); Stefan Mollov, Rennes (FR); Jonathan Robinson, Rennes (FR)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/349,197

(22) PCT Filed: Nov. 24, 2017

(86) PCT No.: PCT/JP2017/043222
§ 371 (c)(1),
(2) Date: May 10, 2019

(87) PCT Pub. No.: WO2018/110312
PCT Pub. Date: Jun. 21, 2018

(65) Prior Publication Data
US 2019/0348906 A1    Nov. 14, 2019

(30) Foreign Application Priority Data

Dec. 16, 2016 (EP) ..................... 16204567

(51) Int. Cl.
*H02M 1/32* (2007.01)
*G01K 3/06* (2006.01)
(Continued)

(52) U.S. Cl.
CPC ............... *H02M 1/32* (2013.01); *G01K 3/06* (2013.01); *G01K 3/10* (2013.01); *H02M 1/088* (2013.01);
(Continued)

(58) Field of Classification Search
CPC .... G01K 3/06; G01K 3/10; H03K 2017/0806; H03K 7/08; H02M 1/32; H02M 1/088;
(Continued)

(56) References Cited

U.S. PATENT DOCUMENTS 8,975,663 B2 * 3/2015 Okamoto ............ H01L 27/0248
257/140
9,046,912 B1 * 6/2015 Liu ........................ H03K 17/14
(Continued)

*Primary Examiner* — Thomas J. Hiltunen
(74) *Attorney, Agent, or Firm* — Birch, Stewart, Kolasch & Birch, LLP

(57) ABSTRACT

The present invention concerns a method for controlling the temperature of a multi-die power module, comprising:
determining and memorizing a first weighted arithmetic mean of junction temperatures of the dies of the multi-die power module,
determining successively another weighted arithmetic mean of junction temperatures of the dies,
checking if the difference between the other weighted arithmetic mean and the memorized weighted arithmetic mean is lower than a first predetermined value,
enabling a modification of the duty cycle of an input signal to apply to at least one selected die of the multi-die power module if the difference is lower than a first predetermined value,
disabling a modification of the duty cycle of the input signal to apply to the at least one die of the multi-die power module if the difference is not lower than the first predetermined value.

10 Claims, 6 Drawing Sheets

(51) Int. Cl.
*G01K 3/10* (2006.01)
*H02M 1/088* (2006.01)
*H03K 7/08* (2006.01)
*H02M 1/00* (2006.01)

(52) U.S. Cl.
CPC ....... *H03K 7/08* (2013.01); *H02M 2001/0012* (2013.01); *H02M 2001/327* (2013.01)

(58) Field of Classification Search
CPC ... H02M 2001/0012; H02M 2001/327; H02M 2001/325
See application file for complete search history.

(56) References Cited

U.S. PATENT DOCUMENTS

| | | | |
|---|---|---|---|
| 9,190,834 B2* | 11/2015 | Casares | H02H 3/05 |
| 9,562,812 B2* | 2/2017 | Yoshimura | G01K 3/14 |
| 9,905,170 B2* | 2/2018 | Carpenter | G09G 3/3406 |
| 10,277,218 B2* | 4/2019 | Ewanchuk | H02M 1/088 |
| 2017/0324318 A1* | 11/2017 | Ewanchuk | H02M 1/32 |
| 2018/0372553 A1* | 12/2018 | Ewanchuk | H03K 17/122 |
| 2019/0146026 A1* | 5/2019 | Kimura | G01K 7/01 324/750.03 |
| 2019/0204889 A1* | 7/2019 | Kaeriyama | G01K 7/01 |
| 2019/0326887 A1* | 10/2019 | Kaya | H03K 3/011 |
| 2020/0236823 A1* | 7/2020 | Ewanchuk | H05K 7/20945 |

* cited by examiner

DEVICE AND METHOD FOR CONTROLLING TEMPERATURE OF MULTI-DIE POWER MODULE

TECHNICAL FIELD

The present invention relates generally to a device and a method for controlling the temperature of a multi-die power module.

BACKGROUND ART

Due to limitations in semiconductor manufacturing processes, there is a practical limit in the total semiconductor area for a single power die. Hence, a high power module typically contains several dies in parallel to achieve a given current rating.

However, due to non-ideal constraints on geometry and electrical parameter variations, the temperature distribution within the set of parallel dies is typically non-uniform. As a consequence, the hottest die limits the total amount of power which the module can dissipate and the non-uniform temperature distribution causes unequal aging of each die, limiting the effectiveness of using parallel devices.

SUMMARY OF INVENTION

The present invention aims to allow a temperature control of a multi-die power module that is reliable using a closed-loop temperature control in order to increase the lifespan of the multi-die power module by reducing local hot spot temperatures.

To that end, the present invention concerns a device for controlling the temperature of a multi-die power module, characterized in that the method comprises the steps of:
determining a first weighted arithmetic mean of junction temperatures of the dies of the multi-die power module and memorizing the weighted arithmetic mean,
determining successively another weighted arithmetic mean of junction temperatures of the dies of the multi-die power module,
checking if the difference between the other weighted arithmetic mean and the memorized weighted arithmetic mean is lower than a first predetermined value,
enabling a modification of the duty cycle of an input signal to apply to at least one selected die of the multi-die power module if the difference between the other weighted arithmetic mean and the memorized weighted arithmetic mean is lower than a first predetermined value,
disabling a modification of the duty cycle of the input signal to apply to the at least one die of the multi-die power module if the difference between the other weighted arithmetic mean and the memorized weighted arithmetic mean is not lower than the first predetermined value.

The present invention concerns also a device for controlling the temperature of a multi-die power module, characterized in that the device comprises:
means for determining a first weighted arithmetic mean of junction temperatures of the dies of the multi-die power module and memorizing the weighted arithmetic mean,
means for determining successively another weighted arithmetic mean of junction temperatures of the dies of the multi-die power module,
means for checking if the difference between the other weighted arithmetic mean and the memorized weighted arithmetic mean is lower than a first predetermined value,
means for enabling a modification of the duty cycle of an input signal to apply to at least one selected die of the multi-die power module if the difference between the other weighted arithmetic mean and the memorized weighted arithmetic mean is lower than a first predetermined value,
means for disabling a modification of the duty cycle of the input signal to apply to the at least one die of the multi-die power module if the difference between the other weighted arithmetic mean and the memorized weighted arithmetic mean is not lower than the first predetermined value.

Thus, the multi-die temperature control device is able to balance the temperatures across the set of parallel dies independently of the loading condition and without any additional sensors.

According to a particular feature, if the difference between the other weighted arithmetic mean and the memorized weighted arithmetic mean is lower than the first predetermined value, the method comprises further step of setting a temperature reference value to the value of the memorized weighted arithmetic mean.

Thus, individual dies can be biased to a greater or lesser extent, allowing the multi-die temperature control device to ignore selected dies in its control, and thereby allowing the multi-die temperature control device to continue to operate if certain dies are faulty.

According to a particular feature, if the difference between the other weighted arithmetic mean and the memorized weighted arithmetic mean is not lower than the first predetermined value, the method comprises further step of setting the value of the memorized weighted arithmetic mean to the value of the other weighted arithmetic mean and the disabling of the modification of the duty cycle of the input signal to apply to the at least one die of the multi-die power module is performed by setting a variable used for modifying the duty cycle of the input signal to apply to the at least one die to a predefined value.

Thus, the multi-die temperature control device ignores large step changes in the load, allowing for the stable convergence of the set of die temperatures in the face of highly dynamic operation.

According to a particular feature, the memorizing of the weighted arithmetic mean is performed a first and second times and if the difference between the other weighted arithmetic mean and the first memorized weighted arithmetic mean is not lower than the first predetermined value, the method comprises further step of setting the value of the first memorized weighted arithmetic mean to the value of the other weighted arithmetic mean and the disabling of the modification of the duty cycle of the input signal to apply to the at least one die of the multi-die power module is performed by interrupting the modification of the duty cycle of the input signal to apply to the at least one die of the multi-die power module.

Thus, the multi-die temperature control device modifies the control signal when the set of dies is in a stable operating point, allowing for the stable convergence of the set of die temperatures in the face of highly dynamic operation.

According to a particular feature, if the difference between the other weighted arithmetic mean and the first memorized weighted arithmetic mean is not lower than the first predetermined value, the method comprises further steps of:

checking if the difference between the other weighted arithmetic mean and the second memorized weighted arithmetic mean is lower than a second predetermined value, setting the value of the second memorized weighted arithmetic mean to the value of the other weighted arithmetic mean and the disabling of the modification of the duty cycle of the input signal to apply to the at least one die of the multi-die power module is performed by setting a variable used for modifying the duty cycle of the input signal to apply to the at least one die to a predefined value if the difference between the other weighted arithmetic mean and the second memorized weighted arithmetic mean is lower than the second predetermined value.

Thus, the multi-die temperature control device ignores large step changes in the load, with an arbitrary pattern, allowing for the stable convergence of the set of die temperatures in the face of highly dynamic operation.

According to a particular feature, the modifying of the duty cycle of the input signal to apply to the at least one die is only performed if the difference between the junction temperature of each die and the reference temperature is lower than a third predetermined value.

Thus, the multi-die temperature control device operation is simplified, allowing the controller action to deal with each successive hotspot in an iterative manner.

According to a particular feature, at the memorizing of the weighted arithmetic mean, the maximum junction temperature of the dies is memorized and at each successive determination of the other weighted arithmetic mean, the maximum junction temperature of the dies of the power dies is determined and the modifying of the duty cycle of the input signal to apply to the at least one die is only performed if the difference between the maximum junction temperature determined at the successive determination and the memorized maximum junction temperature is lower than a fourth predetermined value.

Thus, the multi-die temperature control device is able to reduce the relative magnitude between the temperature hot spots by only saving two values into memory per itration loop, thereby reducing the controller requirements.

According to a particular feature, if the difference between the maximum junction temperature determined at the successive determination and the memorized maximum junction temperature is lower than the fourth predetermined value, the memorized maximum junction temperature value is modified as the minimum of the maximum junction temperature determined at the successive determination and the memorized maximum junction temperature values.

Thus, the multi-die temperature control device is able to track the hot spot temperature without affecting the stability of the system.

According to a particular feature, the modification of the duty cycle of the input signal to apply to the at least one die of the multi-die power module is disabled, the memorized maximum junction temperature value is modified as the maximum junction temperature determined at the successive determination.

Thus, the multi-die temperature control device operation is simplified, allowing the multi-die temperature control device action to deal with each successive hotspot in an iterative manner.

The characteristics of the invention will emerge more clearly from a reading of the following description of example embodiments, the said description being produced with reference to the accompanying drawings.

DESCRIPTION OF EMBODIMENTS

Figure 1:
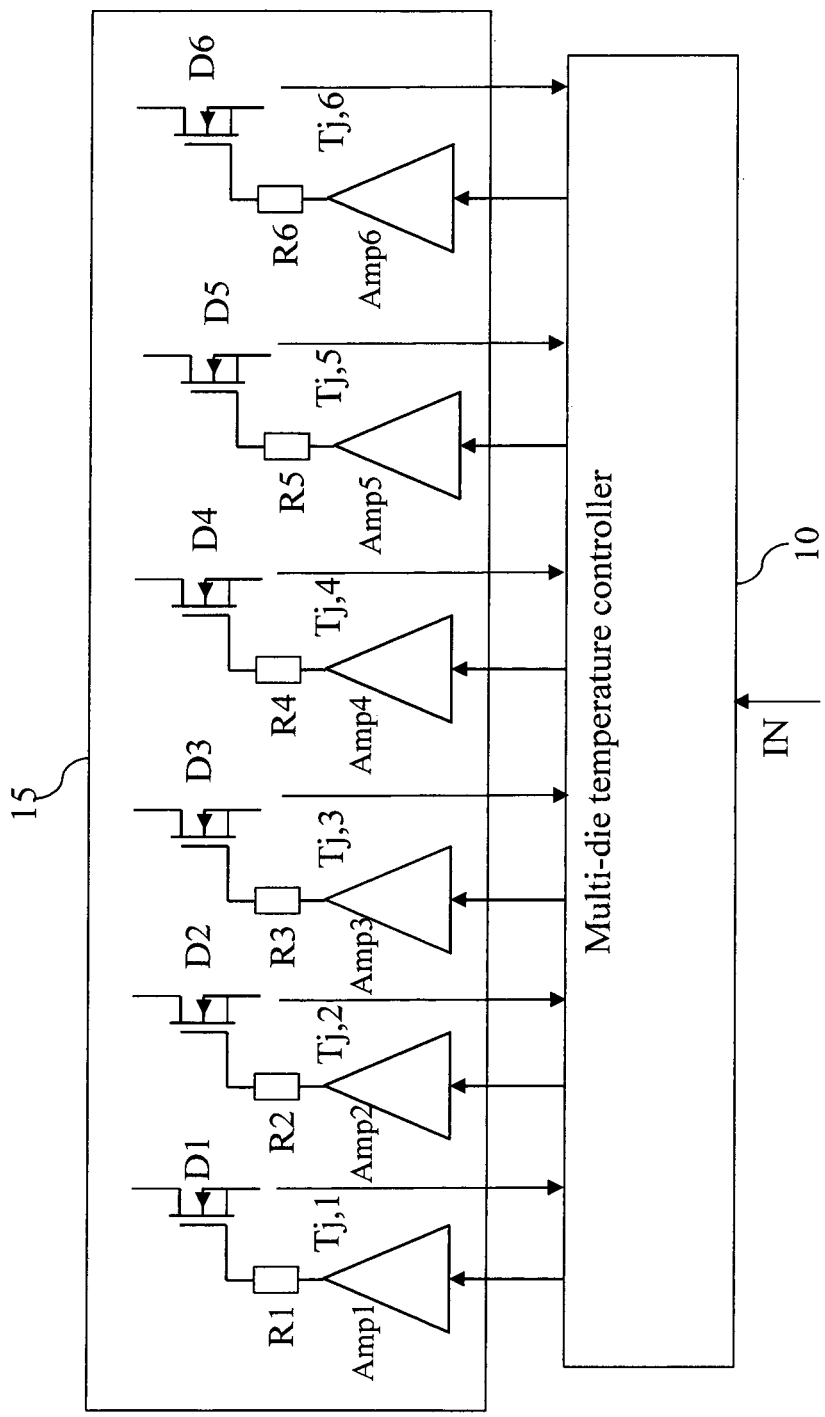
FIG. 1 represents an example of a multi-die power module that is controlled by a multi-die temperature control device according to the present invention.

FIG. 1 represents an example of a multi-die power module that is controlled by a multi-die temperature control device according to the present invention.

The multi-die power module 15 comprises N dies. In the example of FIG. 1, N equal 6.

The multi-die temperature control device 10 receives an input signal IN and drives independently the dies D1 to D6 through respective amplifiers AMP1 to AMP6 and gate resistors R1 to R6.

The multi-die temperature control device 10 uses a closed-loop temperature control that can be either relative or absolute temperature from the dies D1 to D6 in order to increase the lifespan of the multi-die power module 20 by reducing local hot spot temperatures.

Figure 2:
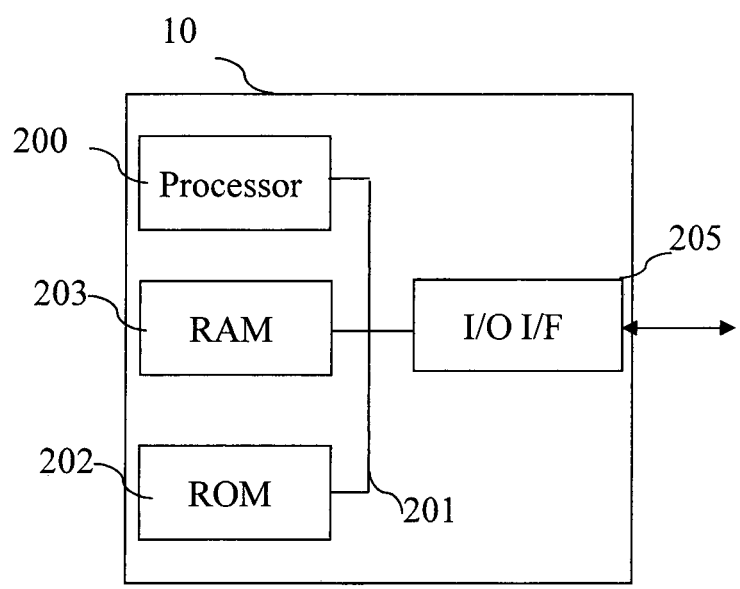
FIG. 2 represents an example of an architecture of a multi-die temperature control device according to the present invention.

According to the invention, the multi-die temperature control device 10:

determines a first weighted arithmetic mean of junction temperatures of the dies of the multi-die power module and memorizes the weighted arithmetic mean, determines successively another weighted arithmetic mean of junction temperatures of the dies of the multi-die power module, checks if the difference between the other weighted arithmetic mean and the memorized weighted arithmetic mean is lower than a first predetermined value, enables a modification of the duty cycle of an input signal to apply to at least one selected die of the multi-die power module if the difference between the other weighted arithmetic mean and the memorized weighted arithmetic mean is lower than a first predetermined value, disables a modification of the duty cycle of the input signal to apply to the at least one die of the multi-die power module if the difference between the other weighted arithmetic mean and the memorized weighted arithmetic mean is not lower than the first predetermined value, FIG. 2 represents an example of an architecture of a multi-die temperature control device according to the present invention.

Figure 3:
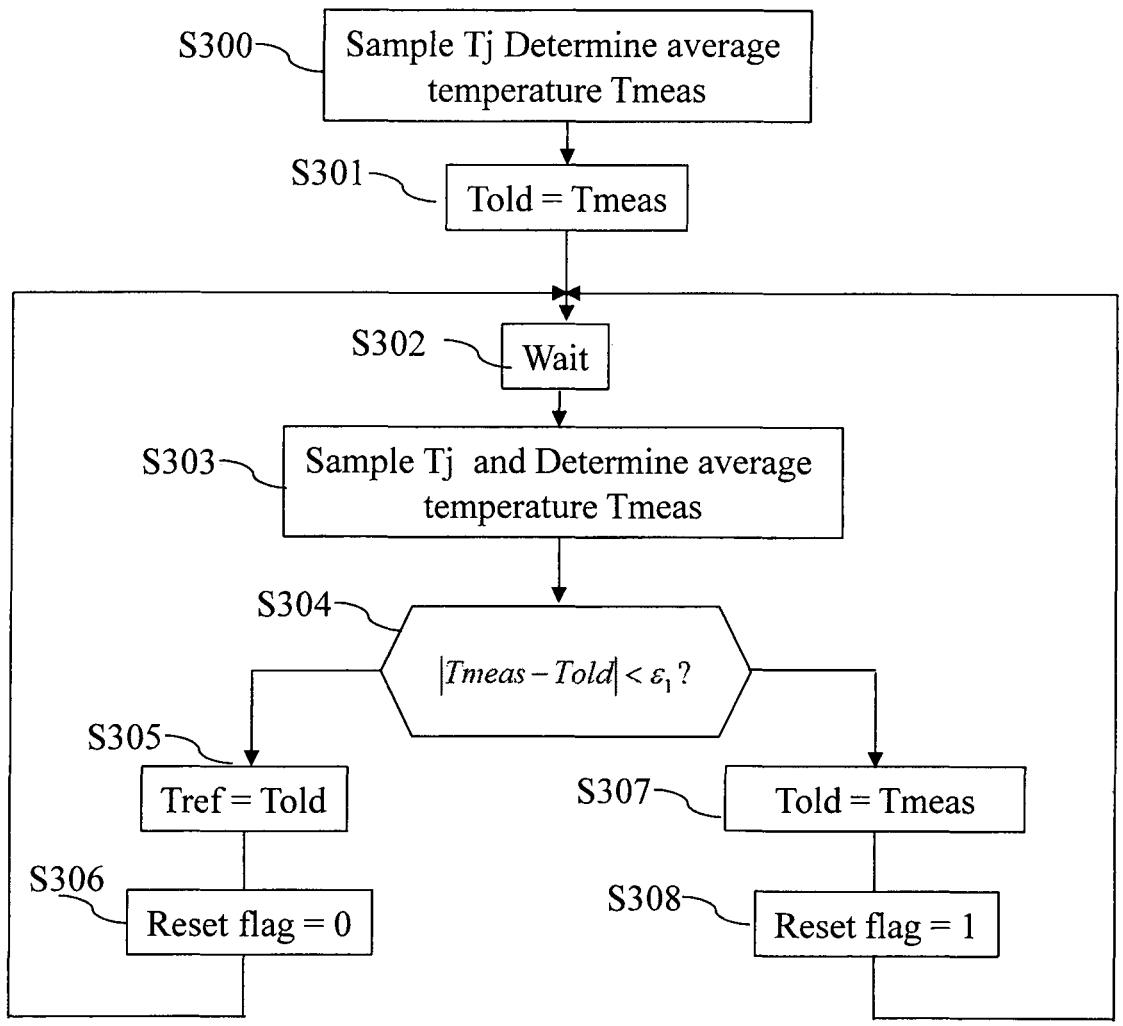
FIG. 3 represents a first example of an algorithm for determining a reference temperature according to the present invention.
Figure 4:
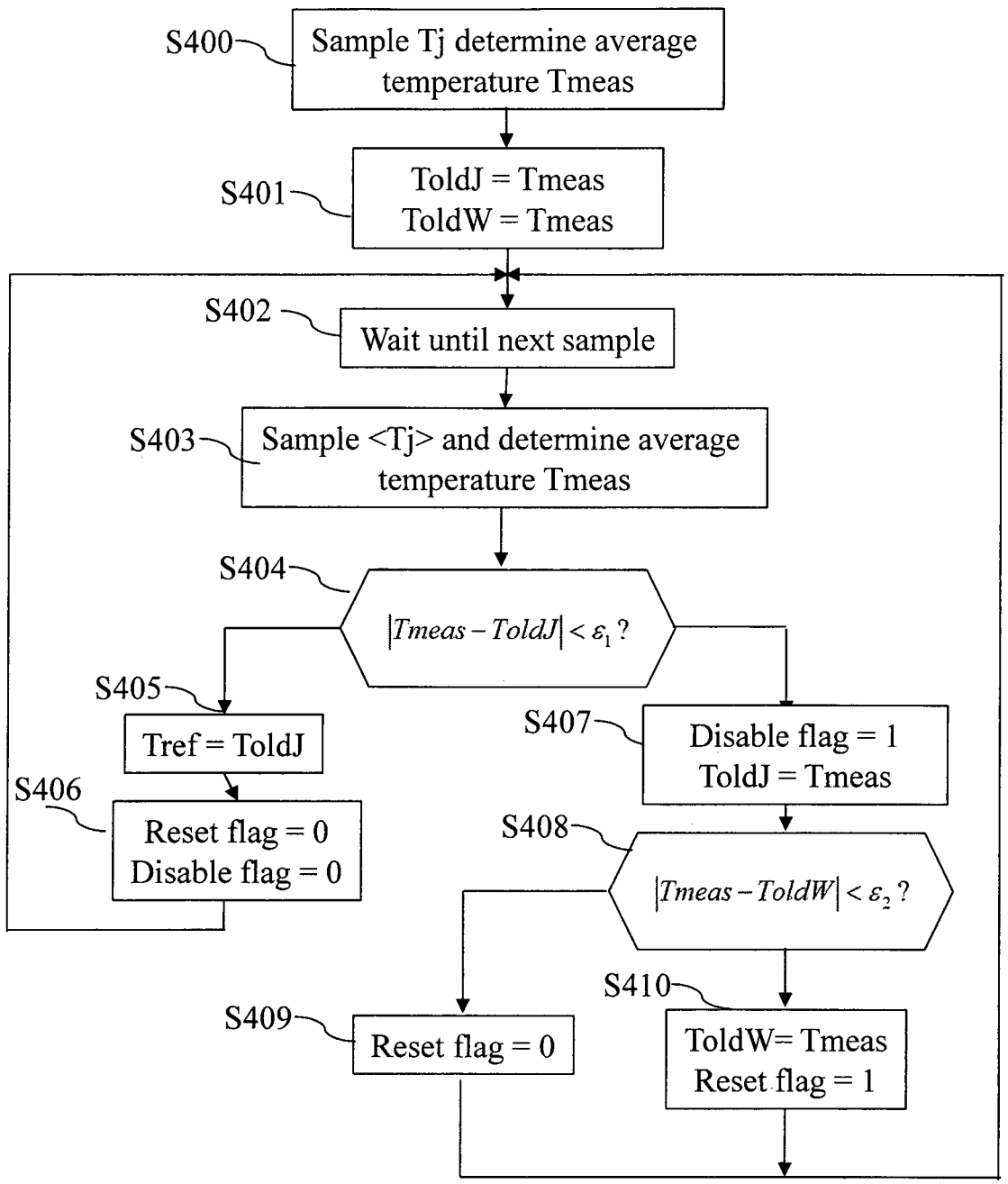
FIG. 4 represents a second example of an algorithm for determining a reference temperature according to the present invention.
Figure 5:
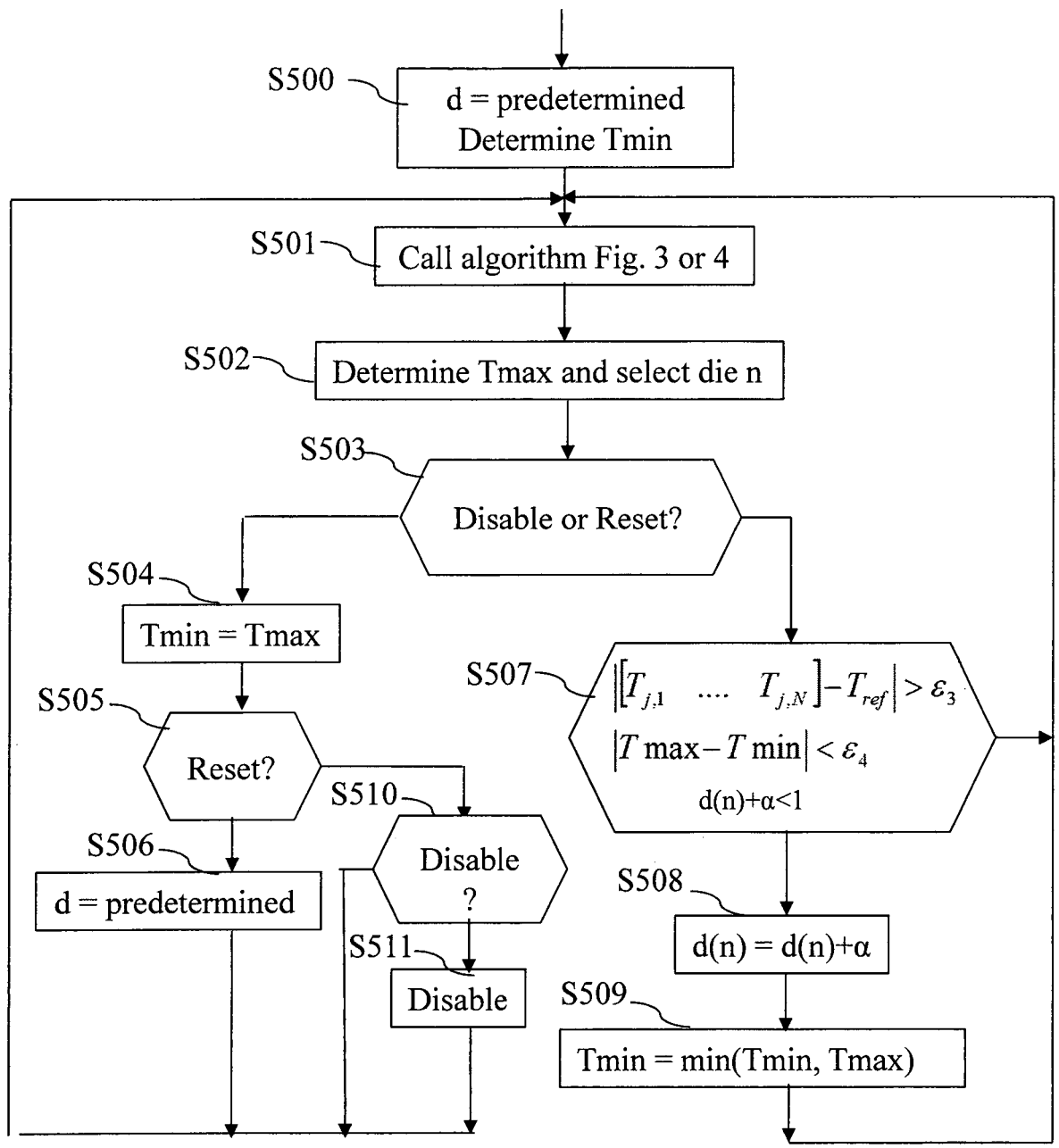
FIG. 5 represents an algorithm for controlling the individual dies of the multi-die power module using a reference temperature according to the present invention.

The multi-die temperature control device 10 has, for example, an architecture based on components connected together by a bus 201 and a processor 200 controlled by a program as disclosed in FIG. 3 or 4 and 5.

The bus 201 links the processor 200 to a read only memory ROM 202, a random access memory RAM 203 and an input output interface I/O IF 205.

The memory 203 contains registers intended to receive variables and the instructions of the program related to the algorithm as disclosed in FIG. 3 or 4 and 5.

The processor 200 receives through the input output I/O IF 205 measurement of the junction temperatures $T_{j,1}$ to $T_{j,6}$ of the dies D1 to D6, an input signal IN and outputs the gates voltages for each dies D1 to D6.

The read-only memory, or possibly a Flash memory 202, contains instructions of the program related to the algorithm as disclosed in FIG. 3 or 4 and 5, when the multi-die temperature control device 10 is powered on, to the random access memory 503.

The multi-die temperature control device 10 may be implemented in software by execution of a set of instructions or program by a programmable computing machine, such as a PC (Personal Computer), a DSP (Digital Signal Processor) or a microcontroller; or else implemented in hardware by a machine or a dedicated component, such as an FPGA (Field-Programmable Gate Array) or an ASIC (Application-Specific Integrated Circuit).

In other words, the multi-die temperature control device 10 includes circuitry, or a device including circuitry, enabling the multi-die temperature control device 10 to perform the program related to the algorithm as disclosed in FIG. 3 or 4 and 5.

FIG. 3 represents a first example of an algorithm for determining a reference temperature according to the present invention.

The present algorithm is disclosed in an example wherein it is executed by the processor 200 of the multi-die temperature control device 10.

At step S300, the processor 200 samples the junction temperatures $T_{j,1}$ to $T_{j,6}$ of the dies D1 to D6 and determines a temperature Tmeas which is representative of the junction temperatures.

The temperature Tmeas is determined according to the junction temperatures Tj,1 to Tj,6 according to the following formula:

$$Tmeas = \frac{1}{N}\sum_{n=1}^{N} K_n T_{j,n}$$

Wherein $K_n$ is a coefficient that is equal to one or is a coefficient that is representative of the die location within the multi-die power module 15 and which ponderates the obtained junction temperatures.

At next step S301, the processor 200 memorises the determined temperature Tmeas value into a variable Told.

At next step S302, the processor 200 waits a time duration which is for example equal to 1 ms.

At next step S303, the processor 200 samples the junction temperatures $T_{j,1}$ to $T_{j,6}$ and determines a temperature Tmeas which is representative of the junction temperatures as disclosed at step 300.

At next step S304, the processor 200 checks if the difference between the value of the temperature Tmeas determined at step S303 and the value of the variable Told is lower than a predetermined value $\varepsilon_1$. The predetermined value $\varepsilon_1$ is for example comprised between 1 to 2 degrees.

If the difference between the value of the temperature Tmeas determined at step S303 and the value of the variable Told is lower than the predetermined value $\varepsilon_1$, the processor 200 moves to step S305. Otherwise, the processor 200 moves to step S307.

At step S305, the processor 200 sets the reference temperature Tref to the value of Told.

At the next step S306, the processor 200 clears a Reset flag to low i.e. to 0 value.

After that, the processor 200 returns to step S302 in order to wait a new sample instance.

At the step S307, the processor 200 sets the variable Told value to the value Tmeas.

At step S308, the processor 200 sets the Reset flag to high value, i.e. to one.

The reset flag that is equal to 1 indicates that the variable d used in the algorithm of FIG. 5 has to be re-initialized to a predetermined value.

After that, the processor 200 returns to step S302.

FIG. 4 represents a second example of an algorithm for determining a reference temperature according to the present invention.

The present algorithm is disclosed in an example wherein it is executed by the processor 200 of the multi-die temperature control device 10.

At step S400, the processor 200 samples the junction temperatures $T_{j,1}$ to $T_{j,6}$ of the dies D1 to D6 and determines a temperature Tmeas which is representative of the junction temperatures.

The temperature Tmeas is determined according to the junction temperatures Tj,1 to Tj,6 according to the following formula:

$$Tmeas = \frac{1}{N}\sum_{n=1}^{N} K_n T_{j,n}$$

Wherein $K_n$ is a coefficient that is equal to one or is a coefficient that is representative of the die location within the multi-die power module 15 and which ponderates the obtained junction temperatures.

At next step S401, the processor 200 memorises the determined temperature Tmeas value into a variable ToldJ and into a variable ToldW At next step S402, the processor 200 waits a time duration which is for example equal to 1 ms.

At next step S403, the processor 200 samples the junction temperatures $T_{j,1}$ to $T_{j,6}$ and determines a temperature Tmeas which is representative of the junction temperatures as disclosed at step S400.

At next step S404, the processor 200 checks if the difference between the value of the temperature Tmeas determined at step S403 and the value of the variable ToldJ is lower than a predetermined value $\varepsilon_1$. The predetermined value $\varepsilon_1$ is for example comprised between 1 to 2 degrees.

If the difference between the value of the temperature Tmeas determined at step S403 and the value of the variable ToldJ is lower than the predetermined value $\varepsilon_1$, the processor 200 moves to step S405. Otherwise, the processor 200 moves to step S407.

At step S405, the processor 200 sets the reference temperature Tref to the value of ToldJ.

At next step S406, the processor 200 clears the Reset flag to 0 and clears a disable flag to 0.

After that, the processor 200 returns to step S402.

At step S407, the processor 200 sets the variable ToldJ to the value Tmeas and sets the Disable flag to 1.

A disable flag that is equal to 1 indicates that the variable d(n) disclosed in FIG. 5 is not applied on the input signal IN, but instead maintains its previous value.

At next step S408, the processor 200 checks if the difference between the value of the temperature Tmeas determined at step S403 and the value of the variable ToldW is lower than a predetermined value $\varepsilon_2$. The predetermined value $\varepsilon_1$ is for example comprised between 5 to 10 degrees.

If the difference between the value of the temperature Tmeas determined at step S403 and the value of the variable ToldJ is lower than the predetermined value $\varepsilon_1$, the processor 200 moves to step S405. Otherwise, the processor 200 moves to step S407.

If the difference between the value of the temperature Tmeas determined at step S403 and the value of the variable ToldW is lower than the predetermined value $\varepsilon_2$, the processor moves to step S409. Otherwise, the processor 200 moves to step S410.

At step S409, the processor 200 sets the Reset flag to 0.

After that, the processor 200 returns to step S402.

At step S410, the processor 200 sets the variable ToldW to the value of Tmeas and sets the Reset flag to 1.

After that, the processor 200 returns to step S402.

FIG. 5 represents an algorithm for controlling the signal provided to the multi-die power according to the present invention.

The present algorithm is disclosed in an example wherein it is executed by the processor 200 of the multi-die temperature control device 10.

At step S500, the processor 200 sets a variable d(n) to a predetermined value, where 'n' is the die number in the array of N dies.

The variable d(n) is a variable that is used to modify the duty cycle of the input signal to be applied to the dies.

The predetermined value of the duty cycle d is, for example, a vector with length equal to N and values equal zero (null vector).

At the same time, the processor 200 determines a temperature noted Tmin.

The temperature Tmin is determined as the maximum of the junction temperatures $T_{j,1}$ to $T_{j,N}$.

At next step S501, the processor 200 obtains the reference temperature Tref determined at step S305 or S405 of the algorithms of FIGS. 3 and 4.

At next step S502, the processor 200 determines a temperature noted Tmax and the position of the hotest die or the positions of the two or three hotest dies.

The temperature Tmax is determined as the maximum of the junction temperatures $T_{j,1}$ to $T_{j,N}$.

At the same step, the processor 200 selects the die, noted n, which corresponds to the maximum of the junction temperatures $T_{j,1}$ to $T_{j,N}$ or selects two or three dies, which correspond to the highest junction temperatures $T_{j,1}$ to $T_{j,N}$.

At next step S503, the processor 200 checks if the disable flag is equal to one or if the reset flag is equal to one.

If the disable flag is equal to one or if the reset flag is equal to one, the processor 200 moves to step S504, otherwise the processor 200 moves to step S507.

At step S504, the processor 200 sets Tmin to the value of Tmax to re-initialize the process loop.

At the next step S505, the processor 200 checks if the reset flag is equal to one. If the reset flag is equal to one, the processor 200 moves to step S506, otherwise the processor moves to step S510.

At the step S506, the processor 200 sets the duty cycle d of each die to the predetermined value, i.e. null value.

After that, the processor 200 returns to step S501 in order to execute a following iteration after a delay, which is for example equal to 1 ms.

At step S510, the processor 200 checks if the disable flag is at high level.

If the disable flag is at high level, the processor 200 moves to step S511. Otherwise, the processor 200 returns to step S501 in order to execute a following iteration after a delay, which is for example equal to 1 ms.

At step S511, the processor 200 disables the application of the variable d(n) to the dies n.

After that, the processor 200 returns to step S501 in order to execute a following iteration after a delay, which is for example equal to 1 ms.

At step S507, the processor 200 checks, for each die temperature $T_{j,1}$ to $T_{j,N}$, if the difference between the die temperature $T_{j,n}$ and the reference temperature Tref is lower than a predetermined value $\varepsilon_3$ and if the difference between the temperature Tmax and the temperature Tmin is lower than a predetermined value $\varepsilon_4$ and if the duty cycle d(n) plus an increment $\alpha$ is lower than one.

If, for each die temperature $T_{j,1}$ to $T_{i,N}$, the difference between the die temperature $T_{j,n}$ and the reference temperature Tref is lower than a predetermined value $\varepsilon_3$ and if the difference between the temperature Tmax and the temperature Tmin is lower than a predetermined value $\varepsilon_4$ and if the duty cycle d(n) plus an increment $\alpha$ is lower than one, the processor 200 moves to step S508. Otherwise, the processor 200 moves to step S501.

For example, the predetermined value $\varepsilon_3$ is equal to 1° C.

For example, the predetermined value $\varepsilon_4$ is equal to 0.5° C.

For example, the increment $\alpha$ is comprised between 0.01 to 0.05.

At step S508, the processor 200 sets the variable d(n) of the selected die or dies at step 502 to the following value d(n)=d(n)+$\alpha$.

The variable d(n) is then substracted to the duty cycle of the input signal IN.

At next step S509, the processor 200 sets the temperature Tmin as equal to the minimum value between the temperatures Tmin and Tmax.

After that, the processor 200 returns to step S501 in order to execute a following iteration after a delay which is for example equal to 1 ms.

FIG. 6 represent signals used for controlling the temperature of the multi-die power module according to the present invention.

Signals given in FIG. 6 are in an example wherein $\varepsilon_1$ is equal to 1.2 and $\varepsilon_2$ is equal to 10.

Figure 6A:
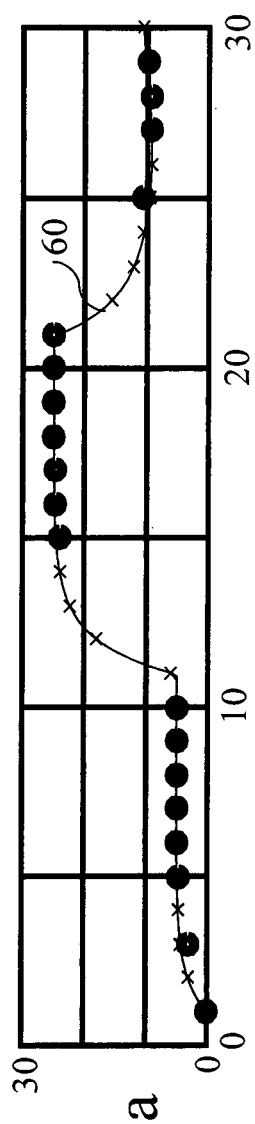
FIG. 6 represents signals used for controlling the temperature of the multi-die power module according to the present invention.

The horizontal axis of FIG. 6a represents the number of iterations of the algorithms of FIGS. 3, 4 and 5.

The vertical axis of FIG. 6a represents the degrees above ambient temperature during the sample iterations of the described processes.

The curve noted 60 in FIG. 6a represents the variation of the average junction temperature, the crosses represent the average junction temperatures determinations, the circles represent the value of the reference temperature Tref determined according to the present invention.

Figure 6B:
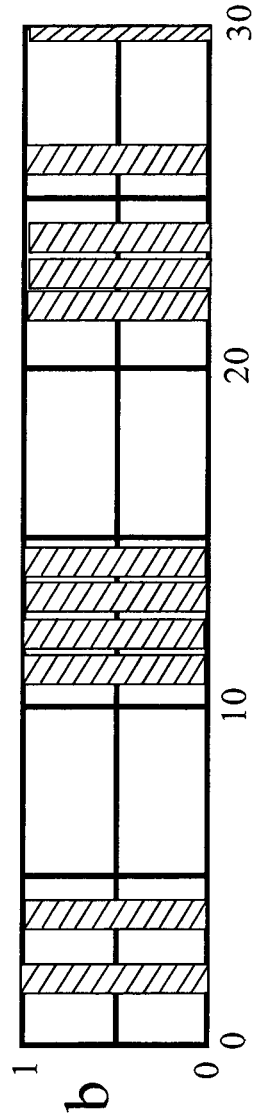

The horizontal axis of FIG. 6b represents the number of iterations of the algorithms of FIGS. 3, 4 and 5.

The vertical axis of FIG. 6b represents the state of the disable flag.

The hashed areas in FIG. 6b represent the period of time wherein the disable flag is at high level, i.e. equal to 1.

Figure 6C:
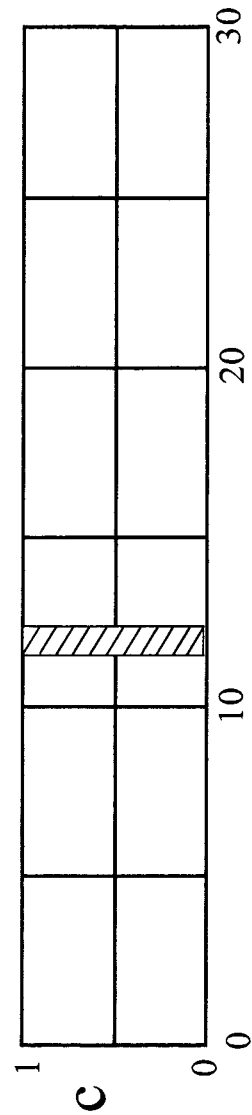

The horizontal axis of FIG. 6c represents the number of iterations of the algorithms of FIGS. 3, 4 and 5.

The vertical axis of FIG. 6c represents the state of the reset flag.

The hashed area in FIG. 6c represents the period of time wherein the reset flag is at high level, i.e. equal to 1. Note that the reset and disable flags are independent in their operation, and hence, both can be set at the same time.

Figure 6D:
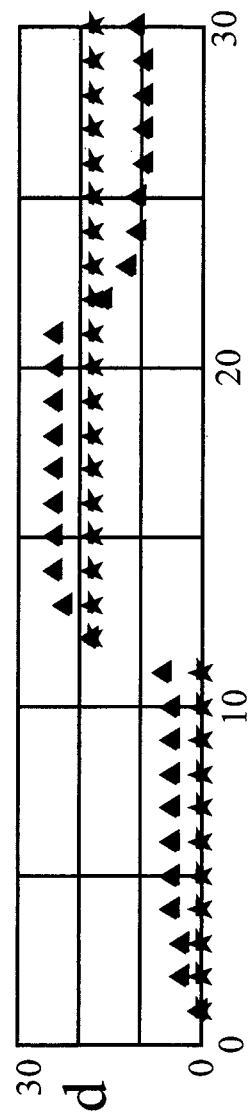

The horizontal axis of FIG. 6d represents the number of iterations of the algorithms of FIGS. 3, 4 and 5.

The vertical axis of FIG. 6d represents the degrees above ambient temperature during the sample iterations of the described processes.

The triangles represent values of the variable ToldJ and the stars represent values of the variable ToldW.

Naturally, many modifications can be made to the embodiments of the invention described above without departing from the scope of the present invention.

The invention claimed is:

1. Method for controlling the temperature of a multi-die power module, comprising:
   determining a first weighted arithmetic mean of junction temperatures of the dies of the multi-die power module and memorizing the weighted arithmetic mean,
   determining successively another weighted arithmetic mean of junction temperatures of the dies of the multi-die power module,
   checking if the difference between the other weighted arithmetic mean and the memorized weighted arithmetic mean is lower than a first predetermined value,
   enabling a modification of the duty cycle of an input signal to apply to at least one selected die of the multi-die power module if the difference between the other weighted arithmetic mean and the memorized weighted arithmetic mean is lower than a first predetermined value,
   disabling a modification of the duty cycle of the input signal to apply to the at least one die of the multi-die power module if the difference between the other weighted arithmetic mean and the memorized weighted arithmetic mean is not lower than the first predetermined value.

2. Method according to claim 1, wherein
if the difference between the other weighted arithmetic mean and the memorized weighted arithmetic mean is lower than the first predetermined value, the method comprising setting a temperature reference value to the value of the memorized weighted arithmetic mean.

3. Method according to claim 1, wherein
if the difference between the other weighted arithmetic mean and the memorized weighted arithmetic mean is not lower than the first predetermined value, the method comprising setting the value of the memorized weighted arithmetic mean to the value of the other weighted arithmetic mean and the disabling of the modification of the duty cycle of the input signal to apply to the at least one die of the multi-die power module is performed by setting a variable used for modifying the duty cycle of the input signal to apply to the at least one die to a predefined value.

4. Method according to claim 1, wherein
the memorizing of the weighted arithmetic mean is performed a first and second times and if the difference between the other weighted arithmetic mean and the first memorized weighted arithmetic mean is not lower than the first predetermined value, the method comprises setting the value of the first memorized weighted arithmetic mean to the value of the other weighted arithmetic mean and the disabling of the modification of the duty cycle of the input signal to apply to the at least one die of the multi-die power module is performed by interrupting the modification of the duty cycle of the input signal to apply to the at least one die of the multi-die power module.

5. Method according to claim 4, wherein
if the difference between the other weighted arithmetic mean and the first memorized weighted arithmetic mean is not lower than the first predetermined value, the method comprises:
   checking if the difference between the other weighted arithmetic mean and the second memorized weighted arithmetic mean is lower than a second predetermined value,
   setting the value of the second memorized weighted arithmetic mean to the value of the other weighted arithmetic mean and the disabling of the modification of the duty cycle of the input signal to apply to the at least one die of the multi-die power module is performed by setting a variable used for modifying the duty cycle of the input signal to apply to the at least one die to a predefined value if the difference between the other weighted arithmetic mean and the second memorized weighted arithmetic mean is lower than the second predetermined value.

6. Method according to claim 1, wherein
the modifying of the duty cycle of the input signal to apply to the at least one die is only performed if the difference between the junction temperature of each die and the reference temperature is lower than a third predetermined value.

7. Method according to claim 6, wherein
at the memorizing of the weighted arithmetic mean, the maximum junction temperature of the dies is memorized and at each successive determination of the other weighted arithmetic mean, the maximum junction temperature of the dies of the power dies is determined and in that the modifying of the duty cycle of the input signal to apply to the at least one die is only performed if the difference between the maximum junction temperature determined at the successive determination and the memorized maximum junction temperature is lower than a fourth predetermined value.

8. Method according to claim 7, wherein
if the difference between the maximum junction temperature determined at the successive determination and the memorized maximum junction temperature is lower than the fourth predetermined value, the memorized maximum junction temperature value is modified as the minimum of the maximum junction temperature determined at the successive determination and the memorized maximum junction temperature values.

9. Method according to claim 8, wherein
the modification of the duty cycle of the input signal to apply to the at least one die of the multi-die power module is disabled, the memorized maximum junction temperature value is modified as the maximum junction temperature determined at the successive determination.

10. Device for controlling the temperature of a multi-die power module, the device comprising:

a determiner determining a first weighted arithmetic mean of junction temperatures of the dies of the multi-die power module and memorizing the weighted arithmetic mean, and determining successively another weighted arithmetic mean of junction temperatures of the dies of the multi-die power module, a checker checking if the difference between the other weighted arithmetic mean and the memorized weighted arithmetic mean is lower than a first predetermined value, an enabler enabling a modification of the duty cycle of an input signal to apply to at least one selected die of the multi-die power module if the difference between the other weighted arithmetic mean and the memorized weighted arithmetic mean is lower than a first predetermined value, a disenabler disabling a modification of the duty cycle of the input signal to apply to the at least one die of the multi-die power module if the difference between the other weighted arithmetic mean and the memorized weighted arithmetic mean is not lower than the first predetermined value.

* * * * *